Sept. 26, 1961 D. S. JENKINS 3,002,134

ELECTRICAL TRANSLATOR DEVICE AND METHOD OF MANUFACTURE

Filed Sept. 19, 1957 3 Sheets-Sheet 1

INVENTOR.
DAVID STEVENS JENKINS

BY Kenway, Jenney, Witter & Hildreth

ATTORNEYS

ELECTRICAL TRANSLATOR DEVICE AND METHOD OF MANUFACTURE

Filed Sept. 19, 1957 3 Sheets-Sheet 2

INVENTOR.
DAVID STEVENS JENKINS
BY
Kenway, Jenney, Witter & Hildreth
ATTORNEYS

Sept. 26, 1961 D. S. JENKINS 3,002,134

ELECTRICAL TRANSLATOR DEVICE AND METHOD OF MANUFACTURE

Filed Sept. 19, 1957 3 Sheets-Sheet 3

INVENTOR.
DAVID STEVENS JENKINS
BY
Kenway, Jenney, Witter & Hildreth
ATTORNEYS

United States Patent Office 3,002,134

Patented Sept. 26, 1961

3,002,134
ELECTRICAL TRANSLATOR DEVICE AND METHOD OF MANUFACTURE

David Stevens Jenkins, Melrose, Mass., assignor, by mesne assignments, to Sylvania Electric Products Inc., Wilmington, Del., a corporation of Delaware Filed Sept. 19, 1957, Ser. No. 684,926
13 Claims. (Cl. 317—236)

This invention relates in general to the manufacture of electrical translating devices and more particularly to the fabrication of semi-conductor diodes.

Presently, there are several varieties of semi-conductor diodes available on the market. Functionally, the various diodes are quite similar inasmuch as each includes a die of semi-conductor material and a cat whisker which contacts the semi-conductor die. Usually the semi-conductor die and cat whisker are enclosed in a capsule of glass or other suitable material which serves to house the active elements and to insulate them one from the other.

Structurally, the various types of semi-conductor diodes differ in more or less degree. Depending upon the application to which the device is to be put, the terminals and components of the diode may be of different shapes and sizes. The present invention, however, is concerned primarily with the two types of diodes illustrated in Pat. No. 2,697,805, issued to Ralph B. Collins, Jr., and assigned to the assignee of the present invention. In FIG. 2 of that patent there is disclosed a semi-conductor diode which might be termed the "soldered" type. This type of diode includes a short tube of insulating material such as glass to the ends of which metal sleeves or eyelets are sealed. In the eyelets in turn there are soldered or otherwise sealed metal rods or studs. To the outer ends of the studs there are customarily butt-welded pigtail leads to facilitate attachment of the device to other circuit components. On the juxtaposed inner ends of the studs the semi-conductor die and cat whisker are mounted in contacting relationship within the capsule.

The operation of soldering the studs into the sleeves may be carried out by suitably plating the studs to which the semi-conductor die and the whisker element are attached and similarly plating the internal surfaces of the eyelets or sleeves. The studs may then be inserted from opposite ends of the capsule into the sleeves or collars to bring the whisker into suitable contact with the die. At the termination of the insertion, each stud is encircled by its respective eyelet and is then soldered thereto.

In FIG. 1 of the above cited Collins patent, a diode is shown which is somewhat less expensive and simpler in structure than that shown in FIG. 2. It includes a pair of leads one having a semi-conductor die mounted on its end and the other having a cat whisker mounted at its end. These leads are sealed into opposite ends of a glass tube. The same leads which carry the semi-conductor die and the cat whisker serve as the sealing members. For purpose of identification, this diode may be classified as being of the "glass" type.

In the manufacture of both the so-called glass diode such as disclosed in FIG. 1 of the Collins patent, and the diode using the metallic eyelets into which studs are soldered or otherwise attached as shown in FIG. 2 of the patent, a common difficulty exists. This difficulty stems from the fact that the cat whisker is normally made of fine tungsten wire which is of the order of .005" in diameter. As well may be imagined, the welding of such a fine whisker to either the stud or to the lead wire is a difficult and often wasteful procedure. The disparity in size between the elements being welded to each other leads to considerable trouble in establishing the proper time and temperature of the weld. A welding schedule which might be quite satisfactory insofar as the stud or lead wire of the diodes is concerned, may destroy the very fine tungsten wire and thereby cause waste of time and materials.

Further, bending of the tungsten wire into an S-shape to give the desired spring contact between the whisker end and the semi-conductor die has been a difficult and time-consuming measure. In the soldered metallic eyelet and stud type, the cost of parts is considerable. Furthermore, the preparation of the studs which may include drilling a hole to accommodate the whisker, welding and replating before soldering constitutes a further considerable expense. Finally, and quite important from a cost standpoint, the present techniques do not lend themselves so readily to mechanization as, for example, in feeding the various wire components directly from a reel.

Therefore, it is an object of the present invention to provide an improved method of processing and assembling electrical translating devices.

It is another object of the present invention to provide a method for attaching a fine filamentary lead to a heavier wire.

It is a further object of the present invention to eliminate expensive parts and operations in fabricating diodes.

It is a still further object of the present invention to improve the structural characteristics of diodes.

Among the features of the present invention, is the bonding of a lead wire to a fine cat whisker by a method which requires no welding or other techniques which are inherently difficult and potentially wasteful when utilized with very fine wire. The bonding is accomplished by a crushing technique wherein the lead wire is compressed into an intimate bond with the cat whisker. Another feature of the present invention resides in the elimination of the stud normally utilized to support the cat whisker and supplanting it with a less expensive and simpler coiled spring-like member. Still another feature of the present invention is the elimination of the butt welded pigtail normally utilized with the whisker mount of a soldered type of diode. Improvements in structural strength and in the mounting and forming of the whisker in the glass type of diode are also effected by the present invention. Other objects and features of the invention will be apparent from a reading of the following specification which should be read in conjunction with the attached drawings in which:

Figure 1:
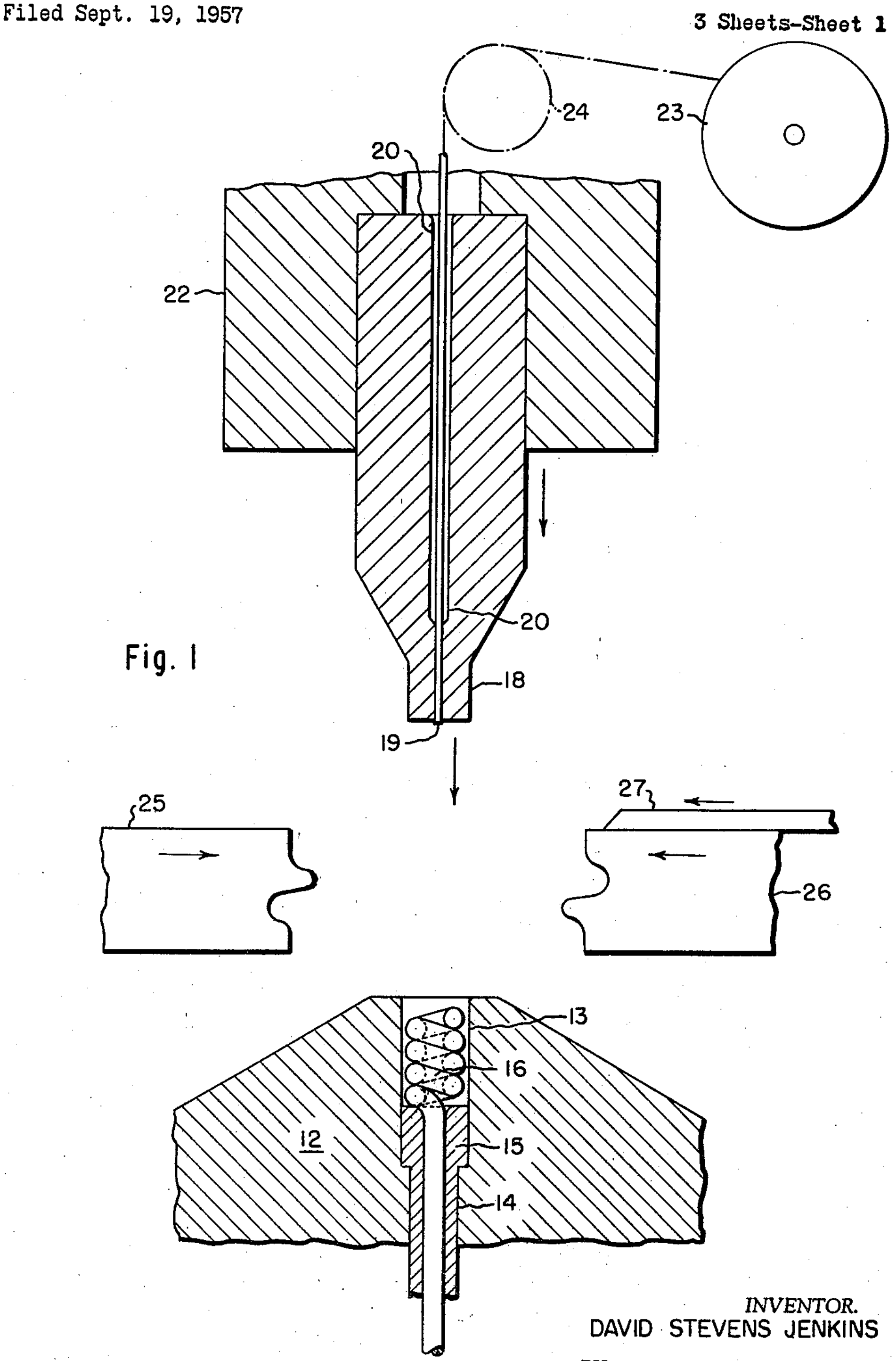
FIG. 1 is a schematic sectional view of apparatus for joining the lead wire and cat whisker and for forming and cutting the whisker.

The apparatus illustrated in FIG. 1 includes a cavity die 12 in which a vertical stepped opening is formed. In the upper part of the die the opening 13, which extends from the top to the shoulder, is of larger diameter than the opening 14 which extends from the shoulder to the bottom of the die.

A "knock-out" member 15 is fitted in the die opening and it, too, is stepped to conform to that opening. The knock-out has a central axial opening and its top surface is counter-sunk in such a manner that no sharp corners exist in its central area. A length of wire passes through the axial opening in the knock-out 15 and is formed into a coil 16 which rests upon the top of the knock-out.

Although automatic coiling and feeding of the wire of which coil 16 is formed are feasible, it may be considered for purposes of the present invention that the coil 16 is formed manually or otherwise, and dropped into the position in which it is shown. The knock-out 15 may also be seated and removed from the cavity die automatically but the details of such handling of the knock-out are not essential to the practice of this invention.

A punch in the form of a hollow tapered ram is formed with an end section 18 designed to fit closely within the opening 13. The punch is disposed adjacent the top of the cavity die 12 and is aligned axially with the vertical opening in the die. A fine central opening 20 is formed axially through the length of the punch. The size of this opening is greatly exaggerated in the drawing for greater clarity. The opening 20 may be of uniform diameter or may be stepped as shown in the drawing. Apparatus such as an arbor press 22, shown fragmentarily, is provided to move the ram vertically and force the punch section 18 into the opening of die 12 under great pressure.

The manner in which the apparatus is used is as follows:

First, a length of wire is wound into a fairly tight helical coil 16 on a very fine mandrel, not shown. The diameter of the mandrel is slightly greater than that of the cat whisker which is to be used. As has previously been noted, the diameter of the cat whisker is of the order of magnitude of .005", and therefore, a mandrel of about .008" is satisfactory. The wire itself may be of about .020" in diameter and the outside diameter of the coil winding which is formed may be about .048" in diameter. The inside diameter of the opening 14 at the base of the cavity die 12 should be several thousandths of an inch larger than the wire diameter to provide adequate clearance for the wire and the inside diameter of the opening 13 should be several thousandths of an inch larger than the outside diameter of the coil 16, again for adequate clearance.

Figure 2:
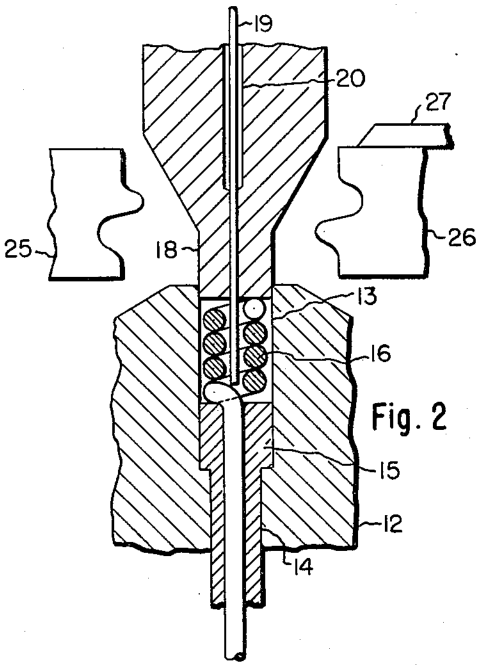
FIGS. 2, 3 and 4 are fragmentary views of the apparatus of FIG. 1 showing subsequent process steps.

After one end of the wire is formed into a coil, the wire is dropped into the opening in the cavity die 12 with the straight portion depending centrally from the coil in the aperture of knock-out 15. The punch 18 is brought down into the opening 13 to contact the top of the coil 16, as illustrated in FIG. 2. At this time, a length of fine tungsten wire 19 is introduced through the aperture 20 into the opening in coil 16. The tungsten wire 19 may be carried and fed by such apparatus as is schematically indicated by a spool 23 and a guide pulley 24 designed to feed the wire through the aperture 20. The whisker wire is passed through at least one turn of the coil and preferably further as shown in FIG. 2. After the whisker wire is in place, the press 22 is utilized to bring the ram down heavily upon the coil 16. The coil 16, being made of ductile material, is compressed by the applied force and, because it is able to expand outwardly against the surrounding wall only slightly, expansion is mostly inward. As a result, the coil deforms and closes tightly upon the whisker wire as is best shown in FIG. 3.

Figure 3:
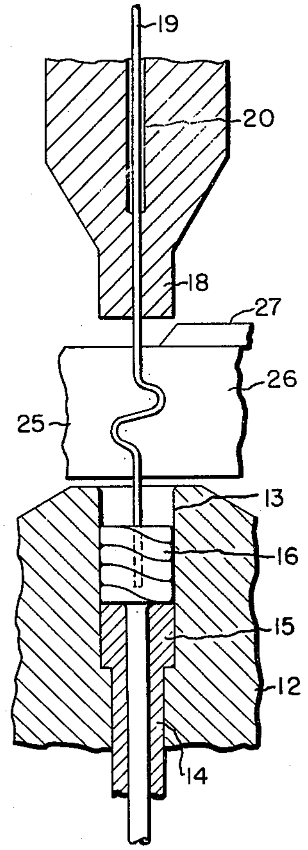
Figure 4:
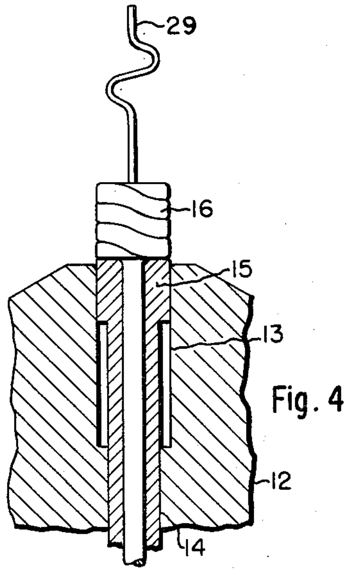

Also as shown in FIG. 3, after the coil is compressed upon the whisker wire, the ram is retracted by press 22, the whisker wire being held stationary in the cavity die during this retraction. While the whisker wire is thus held, a pair of forming tools 25 and 26 are caused to close upon it. The whisker wire 19 is given the general shape of an S by the forming tools after which a cut-off tool 27 is passed over the forming tools to sever the wire leaving a cat whisker 29 tightly held in the coil 16. The forming and cutting tools are then backed off and the coiled lead and formed whisker assembly is removed from the cavity die 12. The removal may be effected by upwardly moving the knock-out 15 from the cavity die as shown in FIG. 4.

Only a very short length of the whisker wire 19 is left extending from punch section 18 so that when the ram is again lowered and the punch section 18 again comes into contact with a newly loaded coil in cavity die 12, the whisker wire is not then bent but is subsequently easily inserted through the coil turns for the desired distance.

Figure 5:
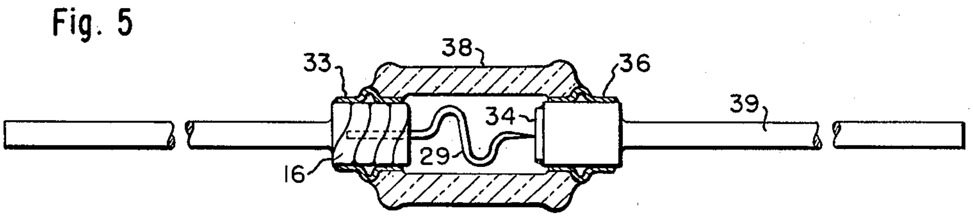
FIG. 5 is a sectional view of the so-called "soldered" diode in which the present invention has been incorporated.

By forming the coil 16 of wire plated with tin or other suitable soldering metal, the coil is made ready to be soldered directly into a sleeve or eyelet in the "soldered" type device. Of course, for point contact devices the tip of the tungsten whisker must first be pointed. In FIG. 5, the coil is seen to fit snugly into an eyelet 33 which in turn is sealed in the glass tube 38. The inside diameter of the opening 13 of cavity die 12 is, of course, related to the inside diameter of the eyelet 33 in order that a proper fit be achieved. The eyelet 33 is coated in a manner similar to that of coil 16 and a good solder joint between the two is easily made after the insertion of the coil.

A semi-conductor die 34 is mounted upon a stud which in turn is soldered into the eyelet 36 in the manner of the prior art. The whisker 29 is brought into suitable contact with the die, of course, before the soldering of the coil 16 to the sleeve 33 is effected. The tube or housing 38 sealed to the eyelets 33 and 36 is usually of glass and the pigtail lead 39 butt-welded to the external end of the stud is provided for connection into a circuit. The other pigtail lead for circuit connection to the cat-whisker 29 is, of course, provided by the same wire from which the coil 16 is formed.

If desired, a coil similar to coil 16 could be used for the mounting of the semi-conductor die as well as for the mounting of the whisker. This would eliminate the butt-welding of the pigtail lead 39 and the relatively expensive machined stud which would be advantageous. However, the problems of attaching the semiconductor die to the stud have not been as great as those of attaching a cat whisker to a stud. For that reason, even though certain advantages are realized by also mounting the semiconductor die upon the end of a coil, the showing in the soldered type diode is restricted to such a mounting of the cat whisker.

Figure 6:
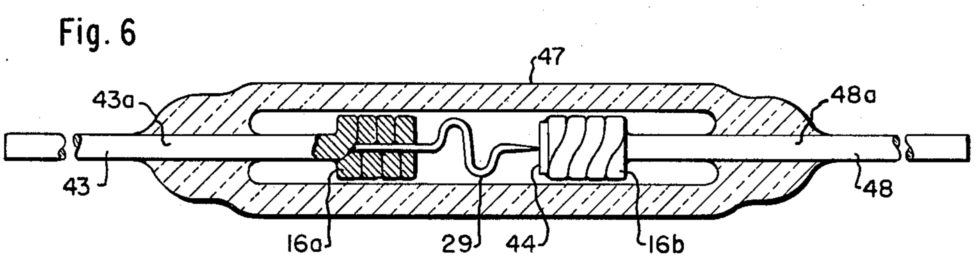
FIG. 6 is a sectional view of a "glass" diode in which the present invention has been incorporated.

In FIG. 6 an application of the present invention to the glass type of diode is shown. In this embodiment of the invention, it is unnecessary, and in fact undesirable, that tin-plated wire be used to form the leads 43 and 48. The coils 16*a* and 16*b* are formed of Dumet wire to which the glass housing 47 is sealed directly. The Dumet wire, which is actually a wire of ductile material coated with a borate or other glassy substance, is stripped of coating adjacent its ends to ensure better electrical contact both internally and externally of the device. The securing of the cat whisker 29 to the coil 16*a* is carried out in the same manner as is the similar operation in the soldered type diode. A second coil 16*b* may be utilized as the support for the semi-conductor die 44, as shown, or the mounting of the die may be as taught by the previously cited Collins patent.

Among the advantages derived from the present invention are its relatively simple adaptation to automatic fabrication of diodes. The lead wire may be supplied directly from a spool to form the necessary lead and coil. Similarly, the wire from which the whisker is made is also fed directly through the ram from a spool. More important, insofar as the soldered type of diode is concerned, is the elimination of the previous practice of drilling an axial hole in the stud, welding the whisker in the hole and butt-welding a pigtail lead to the other end of the stud. Furthermore, it was previously necessary to tin-plate the stud after welding it to the pigtail in order that a suitable surface for soldering would be available. By the use of a plated wire to form the coil, such a step in the fabrication of each unit is eliminated.

Although preferred embodiments of the present invention have been shown and described, the invention should not be limited to only those details. It is believed that the technique of joining leads especially where one lead is of ductile material and the other is not susceptible of easy welding, has general application, especially in the electronics field. Therefore, the present invention should be limited only by the spirit and scope of the appended claims.

What is claimed is:

1. A method for connecting a filamentary wire to an eyelet which comprises, forming a lead wire into a coil, inserting said filamentary wire within said coil, compressing said coil upon said filamentary wire, inserting said coil in said eyelet and sealing said coil into said eyelet.

2. A method for connectng a filamentary wire to an eyelet which comprises, plating a lead wire with soldering metal, forming a portion of said lead wire into a coil, inserting said filamentary wire within said coil, compressing said coil upon said filamentary wire, plating said eyelet with said soldering metal, inserting said coil into said eyelet and heating said eyelet and coil to solder the two together.

3. A method for fabricating a component for a semiconductor device which comprises, plating an eyelet and a lead wire with soldering metal, forming said lead wire into a coil, inserting a filamentary wire within said coil, compressing said coil upon said filamentary wire, inserting said coil into said eyelet, and soldering said coil to said eyelet.

4. A method for fabricating a component for a semiconductor device which comprises, forming a lead wire into a coil, sealing an eyelet into a tubular glass housing, inserting a filamentary wire within said coil, compressing said coil upon said filamentary wire, inserting said coil into said eyelet, and soldering said coil to said eyelet.

5. A method as defined in claim 4 wherein a portion of said filamentary wire extending from said coil is formed into a predetermined shape before said coil is soldered into said eyelet.

6. A method for fabricating the cat whisker and connections thereto for a semiconductor device which comprises forming a portion of a lead wire into a coil, inserting a portion of a filamentary wire into said coil, compressing said coil upon the portion of said filamentary wire inserted therein, forming a portion of said filamentary wire outside of said coil into a predetermined shape, inserting said coil into an eyelet with the uncoiled portion of said lead extending from one end of said eyelet and said formed portion of said filamentary wire extending from the other end of said eyelet, and soldering said coil to said eyelet.

7. A method as defined in claim 6 including the step of sealing said eyelet into a tubular glass housing prior to inserting said coil therein.

8. A method of fabricating the cat whisker and associated components in a semiconductor diode which comprises plating a length of lead wire with soldering metal, forming a portion of said lead wire into a coil, inserting a portion of a filamentary wire into said coil, compressing said coil upon the portion of said filamentary wire inserted therein, sealing an eyelet into one end of a tubular glass housing, plating the exposed surfaces of said eyelet with said soldering metal, forming a portion of said filamentary wire into a predetermined shape, inserting said coil into said eyelet with said shaped filamentary lead within said housing and said uncoiled portion of said lead wire extending outwardly from said housing, and heating said assembly to form a solder bond between said coil and said eyelet.

9. A semiconductor device comprising a tubular housing, an eyelet sealed into an end of said housing, a lead wire having a portion thereof formed into a coil, said coil being sealed in said eyelet, and a cat whisker, said cat whisker having one end thereof disposed within said coil and said coil being compressed upon said cat whisker.

10. A semiconductor device comprising a tubular housing, a first lead wire extending through said housing, a portion of said first lead wire being formed into a first coil, a cat whisker having one end thereof disposed within said first coil, a second lead wire extending through said housing, a portion of said second lead wire being formed into a second coil, said first coil being compressed upon and mechanically bonded to said one end of said cat whisker, and a semiconductor element mounted on the end of said second coil, said cat whisker having its other end in contact with said semiconductor element.

11. A method for fabricating a component for a semiconductor device which comprises, forming a lead wire into a coil, inserting a filamentary wire axially within said coil, confining said coil in a means for restraining said coil from outward expansion while applying pressure to said coil to deform it and close it tightly upon the filamentary wire, and subsequently separating the deformed coil and said means.

12. A method for fabricating a component for a semiconductor device which comprises, forming a lead wire into a coil, inserting a filamentary wire axially within said coil, encircling said coil with restraining means for limiting outward expansion of said coil while applying pressure to said coil axially of said coil to deform said coil and close it inwardly upon the filamentary wire, and subsequently withdrawing the deformed coil and filamentary wire from said restraining means.

13. A method for splicing a first wire to a second wire which comprises forming a portion of said first wire into a coil, inserting said second wire into said coil, confining said coil in a means for restraining said coil from outward expanson while applying pressure to said coil to deform it upon said second wire, and subsequently separating the deformed coil and said means.

References Cited in the file of this patent

UNITED STATES PATENTS

| | | |
|---|---|---|
| 1,320,594 | Windibank | Nov. 4, 1919 |
| 1,465,255 | Dorsey | Aug. 21, 1923 |
| 1,584,533 | Hands | May 11, 1926 |
| 1,946,889 | Wessel | Feb. 13, 1934 |
| 2,790,941 | Dawson | Apr. 30, 1957 |
| 2,805,369 | Wieringen | Sept. 3, 1957 |
| 2,835,810 | Waltz | May 20, 1958 |